(12) United States Patent
Li

(10) Patent No.: US 6,850,124 B1
(45) Date of Patent: Feb. 1, 2005

(54) CIRCUIT, ARCHITECTURE AND METHOD FOR TRACKING LOOP BANDWIDTH IN A FREQUENCY SYNTHESIZER HAVING A WIDE FREQUENCY RANGE

(75) Inventor: Yingxuan Li, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/464,278

(22) Filed: Jun. 17, 2003

(51) Int. Cl.[7] .......................... H03B 27/00; H03L 7/00
(52) U.S. Cl. ........................... 331/57; 331/17; 331/34
(58) Field of Search .............................. 331/57, 17, 34

(56) References Cited

U.S. PATENT DOCUMENTS

| | | |
|---|---|---|
| 5,399,994 A | 3/1995 | Siniscalchi et al. |
| 5,801,934 A | 9/1998 | Lacey et al. |
| 5,892,670 A | 4/1999 | Lacey et al. |
| 5,999,425 A | 12/1999 | Lacey et al. |
| 2002/0105387 A1 * | 8/2002 | Jovenin ........................ 331/17 |

OTHER PUBLICATIONS

Chen, "A Power–Efficient Wide–Range Phase–Locked Loop," IEEE J. Sol. St. Circuits, 37(1), 51–6.
CY7B991-2 Programmable Skew Clock Buffer Data Sheet, Cypress Semiconductor Corp., San Jose, CA.
CY7B995 RoboClock(R) Clock Buffer Data Sheet, Cypress Semiconductor Corp., San Jose, CA.
"Everything You Need to Know About CY7B991/2 . . . ," Cypress Semiconductor Corp., San Jose, CA.

* cited by examiner

*Primary Examiner*—Michael B Shingleton

(57) ABSTRACT

Circuits, architectures, and methods for tracking a phase locked loop (PLL) configuration such that its VCO gain is essentially a linear function of its feedback divider factor over a wide frequency range. The circuit generally includes an oscillator loop having (2n+1) stages, where n is an integer of at least 1, and at least three of the stages comprise a delay circuit and a characteristic control circuit configured to (i) receive divider information and (ii) set or change a delay characteristic of the delay circuit in response to the divider information. The architectures generally relate to PLLs that include a circuit embodying one or more of the inventive concepts disclosed herein. The method generally includes the steps of generating a periodic signal from an oscillator, dividing the periodic signal by a first number, and setting a characteristic property of at least part of the oscillator in accordance with the first number. The present invention advantageously tracks changes to a PLL and adjusts the VCO gain dynamically and in a predictable and controllable manner in response to such changes. The present invention avoids noisy and/or complicated charge pump and/or filter designs, and advantageously improves PLL stability, reliability and/or performance.

101 Claims, 8 Drawing Sheets

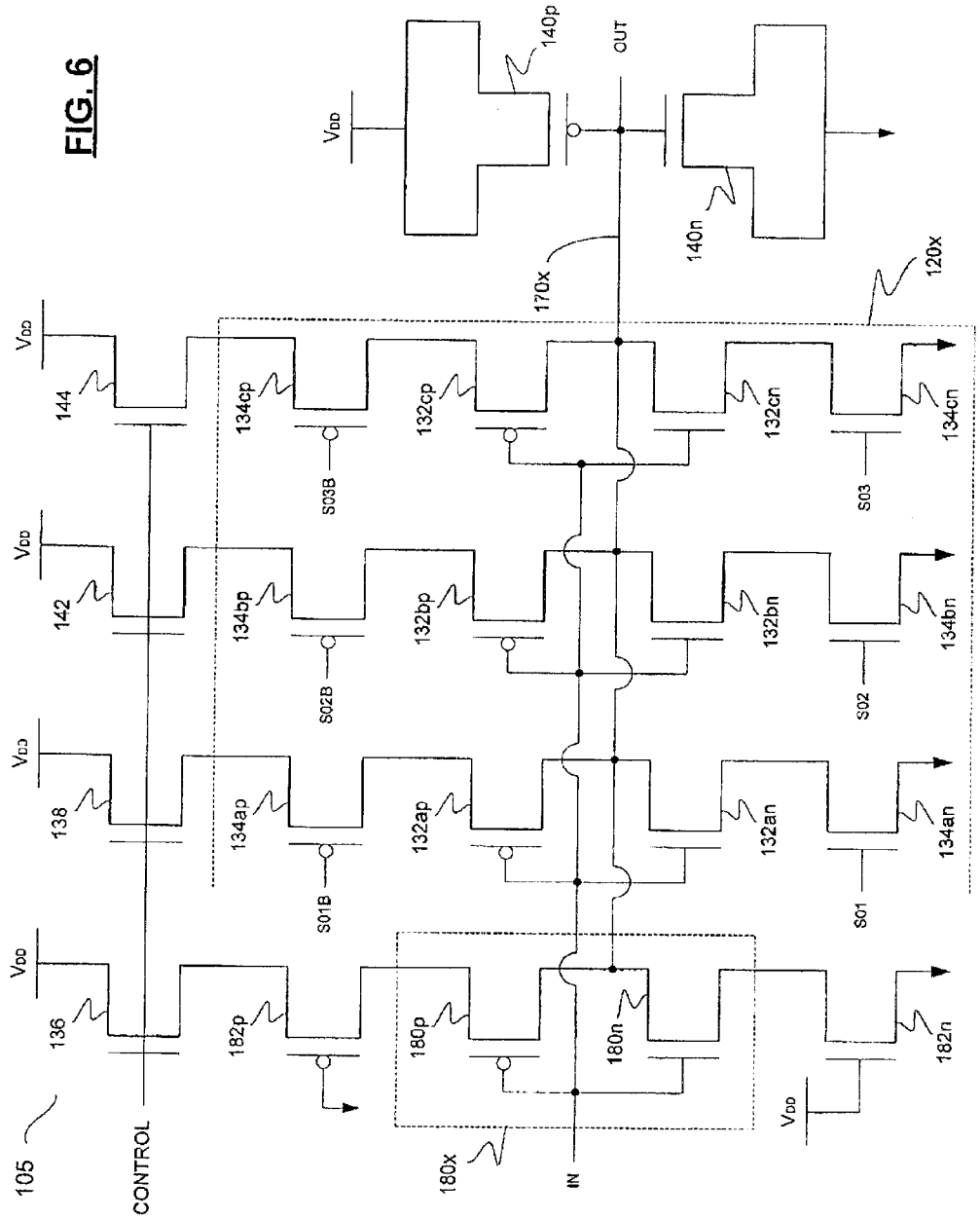

CIRCUIT, ARCHITECTURE AND METHOD FOR TRACKING LOOP BANDWIDTH IN A FREQUENCY SYNTHESIZER HAVING A WIDE FREQUENCY RANGE

FIELD OF THE INVENTION

The present invention generally relates to the field of clock frequency synthesis. More specifically, embodiments of the present invention pertain to circuitry, architectures and methods for tracking loop bandwidth in an MIN type clock frequency synthesizer.

DISCUSSION OF THE BACKGROUND

FIG. 1 shows a conventional M/N type clock frequency synthesizer 10. In the context of the present application, an "M/N type" clock frequency synthesizer is one in which (i) a reference clock signal frequency is divided before it is input into a phase or phase-frequency detector, and (ii) an oscillator output is divided before it is input into the phase or phase-frequency detector. M/N type clock frequency synthesizer 10 generally comprises a divider 12 receiving a reference clock signal having a frequency fref and providing a signal having a frequency fref/N, a phase-frequency detector 14, a charge pump 16, a filter 18, a voltage controlled oscillator (VCO) 20 providing an output clock signal having a frequency fvco, and a divider 22. Dividers 12 and 22 respectively receive configuration signals N[0: (n−1)] and M[0: (m−1)], where N and M are the respective factors by which dividers 12 and 22 divide their respective input signals, and n and m are the respective widths of the configuration signals. Except for the divider 12, the remainder of clock frequency synthesizer 10 is known as a phase locked loop (PLL).

FIG. 2 shows a conventional second-order filter 18, comprising a resistor 40 and a first capacitor 42 in series, and parallel thereto a second capacitor 44. Filter 18 provides a wave-or signal-smoothing function on the output current UP/DN of charge pump 16 to provide a frequency control signal CONTROL to VCO 20. Resistor 40 and second capacitor 44 are coupled to the UP/DN node, and first capacitor 42 and second capacitor 44 are coupled to a ground potential or voltage level. In the embodiment shown in FIG. 2, the UP/DN node is also directly coupled to filter output CONTROL that is input into VCO 20 to adjust or control the current injected into VCO 20, and/or a bias and/or voltage applied to stages of VCO 20.

A common problem that clock frequency synthesizer designers face is how to maintain stability of the PLL over a wide range of frequencies. In a conventional M/N type frequency synthesizer, it is also advantageous to keep the loop bandwidth at least about ten times less than fref/N. At that multiple, a continuous time approximation can be used to model the PLL, and the PLL stability can be maintained relatively easily.

Loop bandwidth generally satisfies the equation $fc=(I/2\pi) \cdot R \cdot (kvco/M)$, where fc is the loop bandwidth, I is the charge pump current, R is the resistance of resistor 40, kvco is the voltage-to-frequency gain of VCO 20, and M is the factor by which divide module 22 divides the VCO output signal 24. The VCO gain kvco generally satisfies the equation $kvco = \Delta(fvco)/\Delta(V)$, where V is the control voltage for the VCO, and $fvco=(M/N) \cdot fref$.

In many applications, it is desirable to keep fref/N constant, primarily to simplify the PLL design, but also in part to support and maintain the stability of the PLL. In those applications where fref may vary or change, it is conventional to change the factor N by which divider 12 divides fref to try to keep fref/N constant. However, there are also applications where fvco may change. In addition, a seller, designer and/or manufacturer of a PLL-containing integrated circuit (IC) may wish to use a single design and/or IC in multiple applications covering a range of fvco values. In such cases, the loop stability can be maintained if one is able to keep the loop bandwidth fixed or essentially constant.

The factor M of feedback divider 22 may vary widely when the VCO 20 operates over a large frequency range. Unfortunately for the designer of a PLL operating over a wide frequency range, feedback divider factor M is in the denominator of the loop bandwidth equation. As a result, changing M has a non-linear, and sometimes dramatic, effect on the corresponding change on the loop bandwidth. This can make it challenging to keep the loop bandwidth fixed over a wide VCO frequency range, and thus, maintain PLL stability over a wide VCO frequency range.

One way designers attempt to control the loop bandwidth function is to control the charge pump current such that (I/M) is a constant value. As a result, when the operable frequency range of the VCO is sufficiently large, designing a charge pump that accurately controls both large and small currents (as well as both large and small changes in currents) can be difficult and/or complicated.

Another approach to addressing this difficulty has been to control resistance and capacitance values in filter 18. In some implementations, switches are placed at inputs to the filter 18 to select from among a group of different resistors and/or capacitors. However, use of such switches tends to introduce noise into the VCO, which can degrade PLL performance.

Therefore, a need exists to control VCO gain over a wide frequency range in a predictable and controllable manner. Ideally, designers seek a technique for making VCO gain a linear function of VCO frequency, without complicated charge pump designs and/or complicated schemes for switching different components into and/or out of noise-sensitive parts of the PLL circuitry.

SUMMARY OF THE INVENTION

Embodiments of the present invention relate to circuitry, architectures and methods for tracking loop bandwidth in a PLL and changing the corresponding VCO gain in a predictable and controllable manner in response thereto. The circuitry generally comprises an oscillator loop having (2n+1) stages, where n is an integer of at least 1, and at least three of the stages comprise a delay circuit and a characteristic control circuit. The delay circuit is generally configured to (i) receive a previous stage output and (ii) generate a next stage input. The characteristic control circuit is generally configured to (i) receive divider information and (ii) set or change a delay characteristic of the delay circuit in response to the divider information.

The architectures generally relate to a PLL comprising an oscillator control circuit, an oscillator having a characteristic setting circuit, and a divider. The oscillator control circuit is generally configured to (i) receive a reference signal and a feedback signal and (ii) provide an oscillator control signal. The oscillator generally comprises a loop of (2n+1) delay stages, where n is an integer of at least 1, and is generally configured to (i) receive the control signal and (ii) provide a native periodic signal. The characteristic setting circuit is generally configured to set or change a delay characteristic of at least one of the delay stages in response to a divider information signal. The divider is generally configured to (i) divide the native periodic signal and (ii) provide the feedback signal and the divider information signal. The method generally comprises the steps of generating a periodic signal from an oscillator, dividing the periodic signal by a first number; and setting a characteristic property of at least part of the oscillator in accordance with the first number.

The present invention advantageously provides a linear relationship between VCO output frequency and VCO gain over a wide range of operating frequencies. Furthermore, the present invention avoids noisy and/or complicated charge pump and/or filter designs. These and other advantages of the present invention will become readily apparent from the detailed description of preferred embodiments below.

BRIEF DESCRIPTION OF THE DRAWINGS

FIG. 6 is a more detailed schematic for the exemplary oscillator delay stage of FIG. 5.

DETAILED DESCRIPTION OF THE PREFERRED EMBODIMENTS

Figure 1:
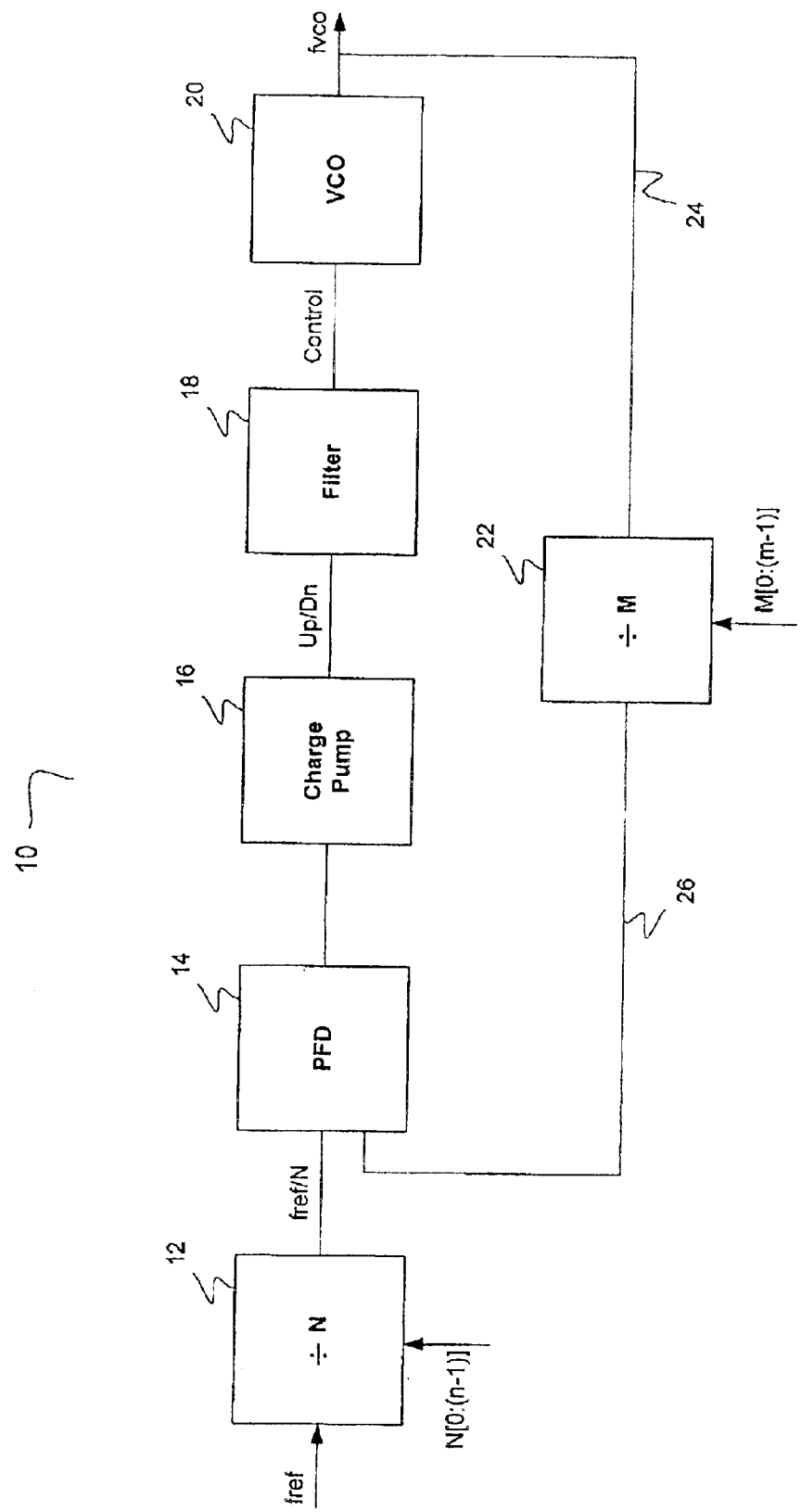
FIG. 1 is a block diagram showing a conventional M/N type PLL architecture.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with," but these terms are also generally given their art-recognized meanings.

The present invention concerns circuits, architectures and methods for tracking loop bandwidth in a PLL having a wide frequency range. The circuit generally relates to an oscillator comprising a loop having (2n+1) stages, where n is an integer of at least 1, and at least three of the stages comprise a delay circuit and a characteristic control circuit. The delay circuit is generally configured to (i) receive a previous stage output and (ii) generate a next stage input. The characteristic control circuit is generally configured to (i) receive divider information and (ii) set or change a delay characteristic of the delay circuit in response to the divider information.

A further aspect of the invention concerns a PLL comprising an oscillator control circuit configured to (i) receive a reference signal and a feedback signal and (ii) provide an oscillator control signal; an oscillator comprising a loop of (2n+1) delay stages, where n is an integer of at least 1, configured to (i) receive the control signal and (ii) provide a native periodic signal, at least one delay stage of the oscillator having a characteristic setting circuit configured to set or change a delay characteristic of in response to a divider information signal; and a divider configured to (i) divide the native periodic signal and (ii) provide the feedback signal and the divider information signal.

Even further aspects of the invention concern a method of tracking loop bandwidth in a PLL, comprising the steps of generating a periodic signal from an oscillator, dividing the periodic signal by a first number, and setting a characteristic property of at least part of the oscillator in accordance with the first number.

The invention, in its various aspects, will be explained in greater detail below with regard to exemplary embodiments.

An Exemplary Circuit

In one aspect, the present invention relates to an oscillator circuit comprising a loop having (2n+1) stages, where n is an integer of at least 1, and at least three of the stages comprise a delay circuit and a characteristic control circuit. The delay circuit is generally configured to (i) receive a previous stage output and (ii) generate a next stage input. The characteristic control circuit is generally configured to (i) receive divider information and (ii) set or change a delay characteristic of the delay circuit in response to the divider information. One key to the inventive concepts disclosed herein is the recognition that one can render the PLL loop bandwidth essentially constant, regardless of VCO frequency, if one is able to satisfy the equation (kvco/M)=K, where K is a constant. The present invention relates to a simple and novel approach to satisfying this equation.

Figure 3:
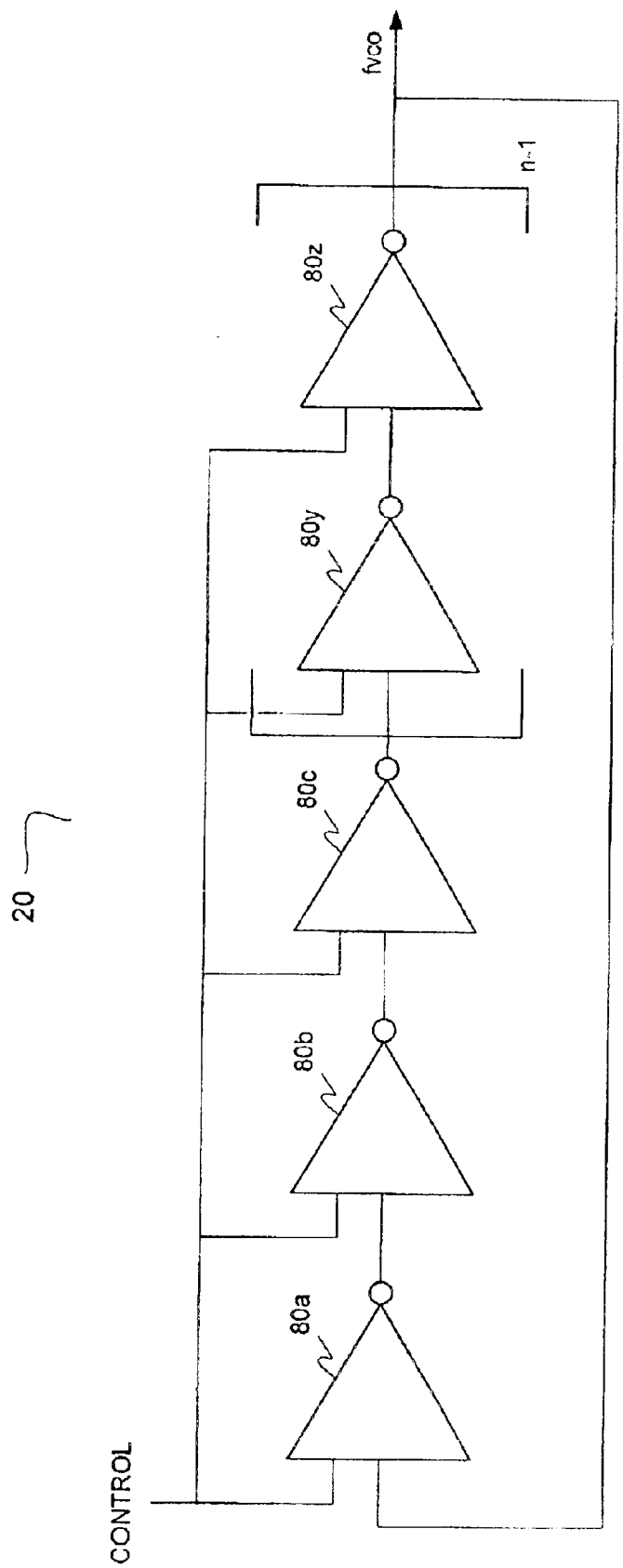
FIG. 3 is a simplified schematic for a conventional VCO.

FIG. 3 shows a conventional oscillator structure 20, including a series of (2n+1) inverters 80*a*, 80*b*, 80*c*, 80*y* and 80*z*. An electric field (not shown) is applied across each inverter. This field may be a voltage differential (e.g., Vdd-ground) or a current (e.g., controlled by an output of filter 18, across a control transistor to one [or more] inverter transistor input terminals). Oscillator 20 outputs a periodic signal having a frequency fvco. The structure 20 may also form a basis for the present oscillator circuit. Thus, in preferred embodiments, each of the delay circuits in the present oscillator comprises an inverter. There may be any integer number (n−1) of 2-inverter units 80*y* and 80*z* in the loop. In some embodiments, the number (n−1) may be programmable or selectable by application of one or more appropriate control signals.

Each stage in oscillator 20 propagates a periodic signal from the preceding or previous stage to the next stage. Thus, for example, if inverter 80*b* is the oscillator stage under consideration, the output of the previous stage 80*a* is the input to oscillator stage 80*b* under consideration, and the output of oscillator stage 80*b* under consideration is the input to next stage 80*c*.

Figure 4:
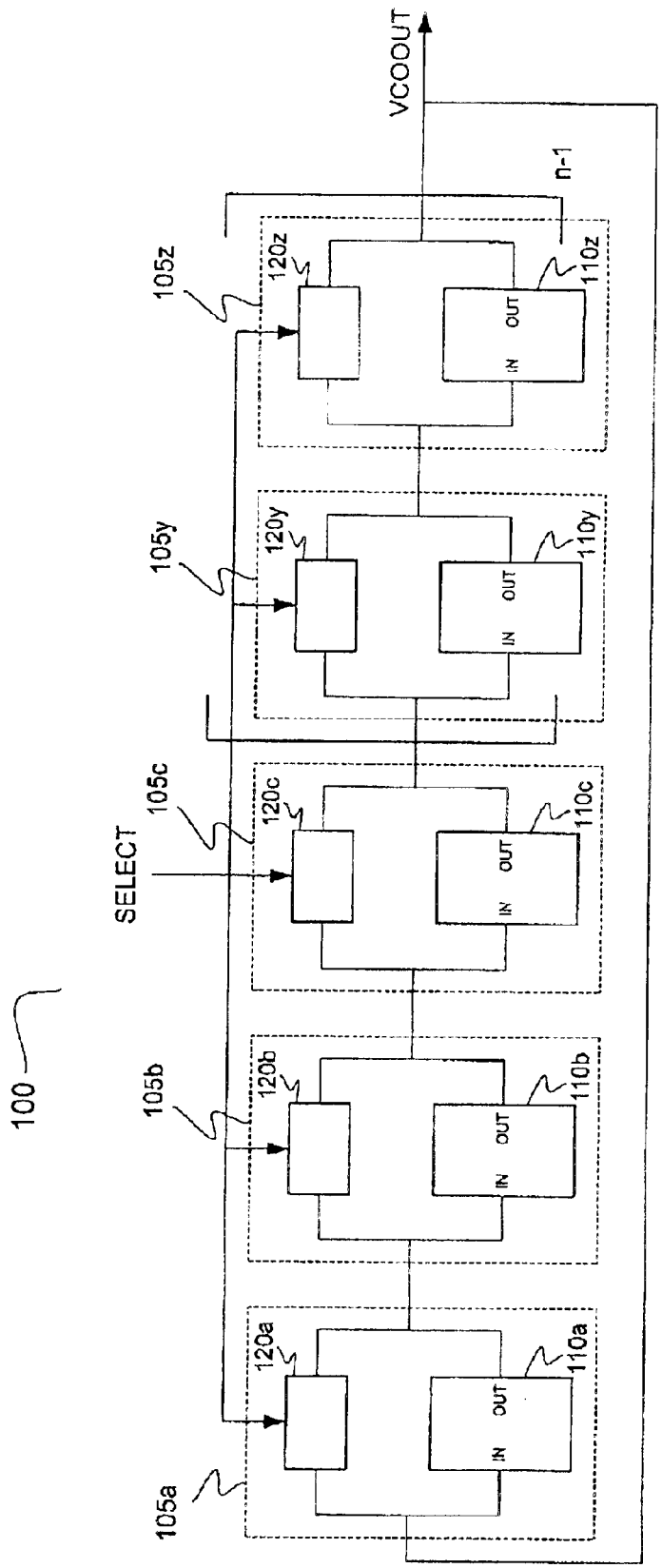
FIG. 4 is a simplified block diagram showing an embodiment of the present oscillator.

Referring now to FIG. 4, a block diagram showing the present oscillator circuit architecture 100. Oscillator 100 comprises a series of (2n+1) stages 105*a*, 105*b*, 105*c*, 105*y* and 105*z*, and provides or generates a periodic signal VCOOUT having a frequency that is native to the VCO design and PLL configuration. The frequency of periodic signal VCOOUT can be divided using one or more conventional dividers, in accordance with known techniques.

Each of the oscillator stages 105x includes a delay circuit 110*x* and a characteristic control circuit 120*x* (where "x" is a, b, c, y or z). Although this implementation is preferred, it is not required that each oscillator stage include both the delay circuit 110*x* and the characteristic control circuit 120*x*. A benefit can be conferred as long as at least three stages of the oscillator include both the delay circuit 110*x* and the characteristic control circuit 120*x*.

In the embodiment of FIG. 4, each delay circuit 110*x* and each characteristic control circuit 120x is configured to receive an output OUT from the previous stage in the loop and generate an input IN for the next stage in the loop. Therefore, in preferred embodiments, the characteristic control circuit is parallel to the delay circuit. Furthermore, in the embodiment of FIG. 4, each characteristic control circuit 120*x* is configured to receive a divider information signal SELECT, which in preferred embodiments, comprises a multi-bit digital signal. For clarity, VCO control signal CONTROL is not shown in FIG. 4, but it is generally input into each delay circuit 110*x* (e.g., as shown in FIG. 3), and preferably, also into each characteristic control circuit 120*x* (as is shown in more detail with regard to FIG. 5).

Figure 5:
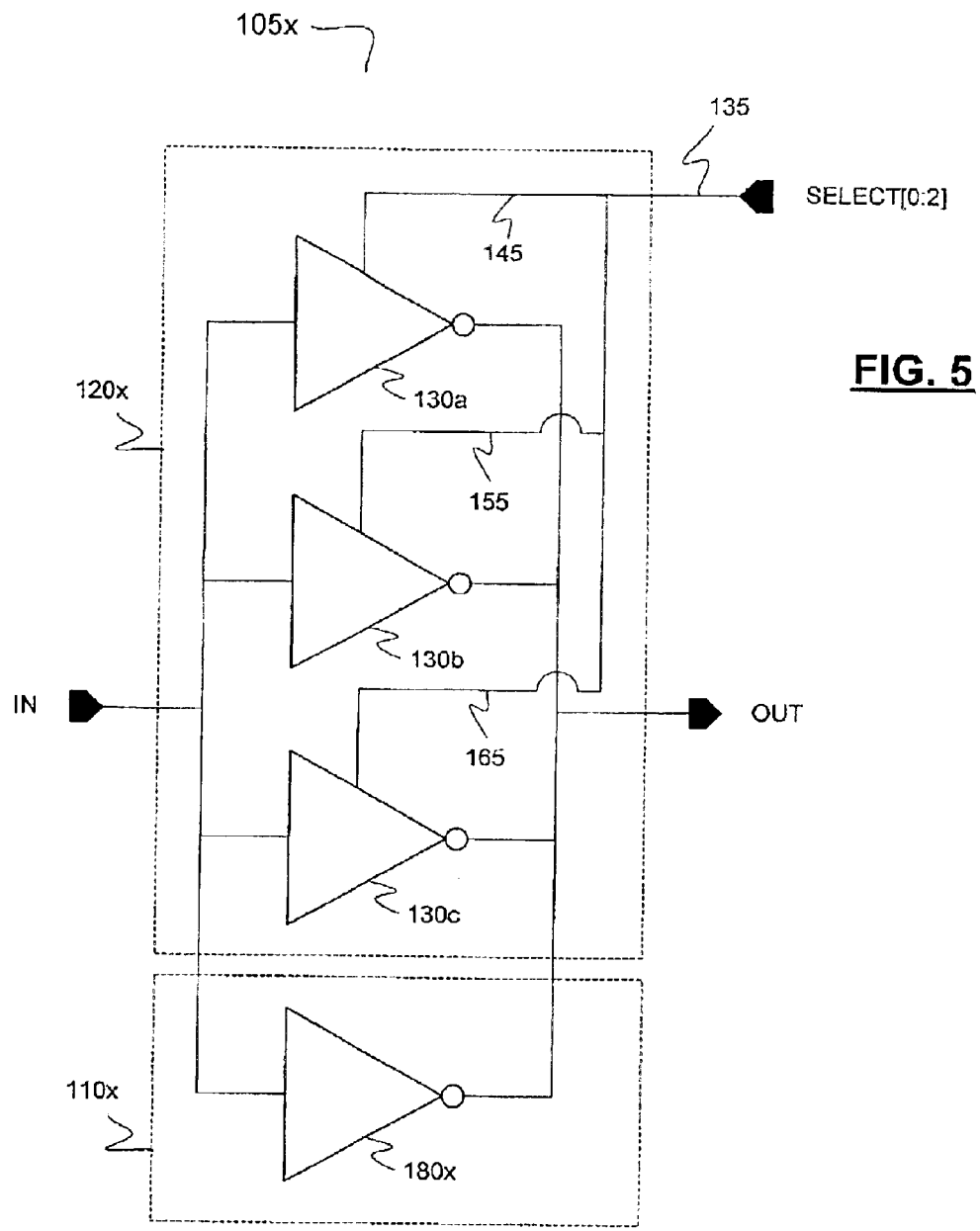
FIG. 5 is a simplified schematic for an exemplary oscillator delay stage of the present invention.

Referring now to FIG. 5, an exemplary implementation of oscillator stage 105*x* is shown. In one implementation of the preferred oscillators, each delay circuit 110*x* comprises an inverter 180*x* (e.g., similar to inverter 80*x* in FIG. 3). Characteristic control circuit 120*x* includes first, second and third three-state buffers 130*a*, 130*b* and 130*c*. While 3 three-state buffers 130 are a preferred implementation of characteristic control circuit 120*x*, any number of three-state buffers (or logical equivalents thereof) may be employed. Thus, in preferred embodiments, at least three (and preferably each) of the characteristic control circuits in the present oscillator comprises a three-state buffer configured to enter a high impedance state in response to a predetermined state of the divider information (e.g., divider information signal SELECT). In more preferred embodiments, the characteristic control circuit further comprises a second three-state buffer configured to enter a high impedance state in response to a second predetermined state of the divider information. In one implementation, the characteristic control circuit further comprises three parallel three-state buffers, each configured to enter a high impedance state in response to a predetermined state of one bit of the divider information.

As shown in FIG. 5, the three-state buffers 130*a*–130*c* are parallel to the delay circuit 110*x* (notably inverter 180*x*) and to each other. Consequently, in preferred embodiments, each of the first and second three-state buffers are (i) parallel to the delay circuit and to each other, and (ii) configured to receive the previous stage output and provide the next stage input. In one implementation, the characteristic control circuit further comprises a third three-state buffer configured to enter a high impedance state in response to a third predetermined state of the divider information, each of the first, second and third three-state buffers are parallel to the delay circuit and to each other, and each of the first, second and third three-state buffers are further configured to receive the previous stage output and provide the next stage input.

As described above, divider information may take the form of a multibit digital signal (e.g., SELECT in FIG. 5). Divider information signal SELECT on multibit bus 135 may be split into three smaller busses 145, 155 and 165, respectively providing one or more bits from multibit bus 135 to each of first, second and third three-state buffers 130*a*–130*c*. Preferably, each three-state buffer in characteristic control circuit 120x receives a one-bit digital signal (which may comprise true and complement values of that bit), and the width (i.e., the total number of bits) of multibit bus 135 equals the sum of the bits of the signals on the divider information busses to each individual three-state buffer 130. Thus, in the present oscillator, the first three-state buffer may receives at least a first bit of a multibit divider information signal, the second three-state buffer may receive at least a second bit of the multibit divider information signal, and the third three-state buffer may receive at least a third bit of the divider information.

In the embodiment shown in FIG. 5, the first three-state buffer changes the delay characteristic of the oscillator delay stage by a first amount, the second three-state buffer changes the delay characteristic by a second amount different from the first amount, and the third three-state buffer changes the delay characteristic by a third amount. While each of the first, second and third amounts may be independently the same as or different from each other, it is preferred that each of the first, second and third amounts be different from each other. In such an implementation, each three-state buffer may receive one bit of the divider information signal, and the three-state buffer that changes the delay characteristic by the largest amount receives the most significant bit of the divider information signal, the three-state buffer that changes the delay characteristic by the second largest amount different receives the second most significant bit, and so on (e.g., the three-state buffer that changes the delay characteristic by the smallest amount receives the least significant bit of the divider information signal).

It is also preferred that the first, second and third amounts of delay characteristic change have a relationship to each other, such as linear (e.g., the first three-state buffer changes the delay characteristic by one unit, the second three-state buffer changes the delay characteristic by two units, and the third three-state buffer changes the delay characteristic by three units), multiplicative (e.g., the first three-state buffer changes the delay characteristic by one unit, the second three-state buffer changes the delay characteristic by three units, and the third three-state buffer changes the delay characteristic by six units), or exponential (e.g., the first three-state buffer changes the delay characteristic by two units, the second three-state buffer changes the delay characteristic by four units, and the third three-state buffer changes the delay characteristic by eight units). In one implementation, the first amount is q, the second amount is about $q^2$, and the third amount is about $q^3$, where q is the number of units of change in the delay characteristic.

As described above, one key to the invention is solving the equation (kvco/M)=K. The equation can be solved by adjusting one or more of a number of parameters in the VCO that affect kvco by roughly the same relative amount that M changes. This is why transmitting divider information (and more specifically, a signal corresponding to the divider factor M) to the VCO is important in exemplary embodiments of the present invention.

In the implementation of FIGS. 4–5, each stage 105 of the ring oscillator can be considered to be a delay stage. Thus, the characteristic to be controlled (e.g., to be set to a particular or predetermined value, or changed to a new and/or different value) in stages of the present oscillator 100 is generally a type of delay characteristic. Parameters that affect the characteristic delay of an oscillator delay stage 105x include a delay time (e.g., the length of time that a signal IN input into a stage takes to be output from the stage as signal OUT), a transition time (e.g., the length of time that a signal OUT output from a stage takes to rise from a digital 0 level to a digital 1 level, fall from a digital 1 level to a digital 0 level, an equivalent thereof, or a combination thereof), a rise rate (e.g., the rate {e.g., in mV/msec} at which a signal OUT output from a stage takes to rise from a digital 0 level to a digital 1 level), a fall rate {e.g., the rate (e.g., in mV/msec} at which a signal OUT output from a stage takes to fall from a digital 1 level to a digital 0 level), a resistance (e.g., across stage 105, from IN to OUT), a capacitance (e.g., of the nodes IN and/or OUT), a number of transistor legs (to be described below in reference to FIG. 6) and a current sourcing and/or sinking capability. Adding, removing, activating or deactivating transistors parallel to those in inverter 180x to provide additional or fewer paths between a current or voltage source Vdd and output OUT is one implementation for setting or changing an oscillator stage's current sourcing ability. Similarly, adding, removing, activating or deactivating transistors parallel to those in inverter 180x to provide additional or fewer paths between a ground potential and output OUT is one implementation for setting or changing an oscillator stage's current sinking ability. In preferred embodiments, the delay characteristic comprises a delay time, an effective transistor size and/or a number of transistor legs.

As described above, divider information (and more specifically, a signal corresponding to the divider factor M) is communicated to the VCO. In one embodiment, the divider information is taken from a divider factor M applied to a periodic signal output from the oscillator. M cannot equal 0, and must be greater than or equal to 1. Typically, this feedback divider factor M is a positive integer, generally of 2 or more.

In a preferred implementation, the divider module information comprises a digital signal p bits wide, where p is an integer and $2^p$ is less than or equal to a maximum value of the divider module factor M. At sufficiently high maximum values of M (e.g., greater than or equal to 16), $2^p$ can be less than the maximum value of M ("Mmax"), and the equation (kvco/M) K can still generally hold true by correlating particular values of M with a predetermined state of the p bit wide digital signal. In this embodiment, the multi-bit digital signal has a width that generally comprises the corresponding number of most significant bits of the divide module configuration signal (e.g., M[0: (m−1)] in FIGS. 1 and 8).

For example, in one implementation where Mmax is 80, p can be as small as 4, 5 or 6. In this implementation, when M is in the high end of the range (e.g., >32), relatively large adjustments are made to the delay characteristic by one or more of the three-state buffers 130. On the other hand, when M is in the low end of the range (e.g., from 4 to 16), relatively small adjustments are made to the delay characteristic by one or more three-state buffers 130. Generally, in this type of implementation, different three-state buffers 130 make different adjustments to the delay characteristic of an oscillator stage.

FIG. 6 shows a more detailed, exemplary circuit schematic for the oscillator stage 105 of FIGS. 4–5. For layout convenience and simplicity, oscillator stage 105 may comprise nine pairs of CMOS transistors: 180p and 180n, 182p and 182n, 132ap and 132an, 134ap and 134an, 132bp and 132bn, 134bp and 134bn, 132cp and 132cn, 134cp and 134cn, and 140p and 140n. CMOS transistor pair 180p and 180n correspond to inverter 180x in FIG. 5. Optional CMOS transistor pair 182p and 182n are configured as small resistors or pass gates to keep inverter 180x on at all times, and they respectively couple Vdd and ground to inverter 180x. CMOS transistor pairs 132ap and 132an, 132bp and 132bn, and 132 cp and 132cn are configured to receive a previous stage output IN and provide a next stage input OUT in parallel with inverter 180x. CMOS transistor pairs 134ap and 134an, 134bp and 134bn, and 134 cp and 134cn respectively receive individual divider information signals S01, S02 and S03. NMOS transistors 134an, 134bn, and 134cn receive true divider information signals S01, S02 and S03, and PMOS transistors 134ap, 134bp and 134 cp receive the complementary divider information signals S01B, S02B and S03B. As described above, in a preferred embodiment, each of signals S01, S02 and S03 are one-bit, digital signals. VCO control signal CONTROL (see the above discussion with regard to FIGS. 1–3) is received at each of NMOS transistors 136, 138, 142 and 144, which are configured as source followers or unity gain buffers and which respectively couple a power supply voltage (e.g., VDD) to inverter 180x and the three three-state buffers that constitute the characteristic control circuit 120x. Alternatively, NMOS transistors 136, 138, 142 and 144 may be replaced by a single transistor configured as a source follower or unity gain buffer and, the drain of which is coupled to each of p-channel transistors 182*p* (or its equivalent), 134*ap*, 134*bp*, and 134 cp. In a further alternative embodiment, a single n-channel transistor receiving VCO control signal CONTROL may serve as a source follower or unity gain buffer for each stage of VCO 100. Optional CMOS transistor pair 140*p* and 140*n* are configured as capacitors, to add capacitance to next stage input node OUT. Thus, each of the three-state buffers may individually comprise first and second PMOS transistors in series and first and second NMOS transistors in series, the first PMOS transistor and the first NMOS transistor being configured to receive the previous stage output and provide the next stage input, and the second PMOS transistor and the second NMOS transistor being configured to receive the divider information.

In preferred embodiments, the delay characteristic comprises a delay time and/or a number of transistor legs. As can be seen in FIG. 6, each bit S01, S02 and S03 (and its complement) of divider information signal SELECT activates or deactivates current-sourcing and current-sinking paths parallel to those of inverter 180*x*. As M increases, activating one or more three-state buffers 130 adds current-sourcing and current-sinking paths to the oscillator stage, thereby reducing the transition times, delay time and/or effective resistance of the oscillator stage, and increasing kvco.

Figure 7A:
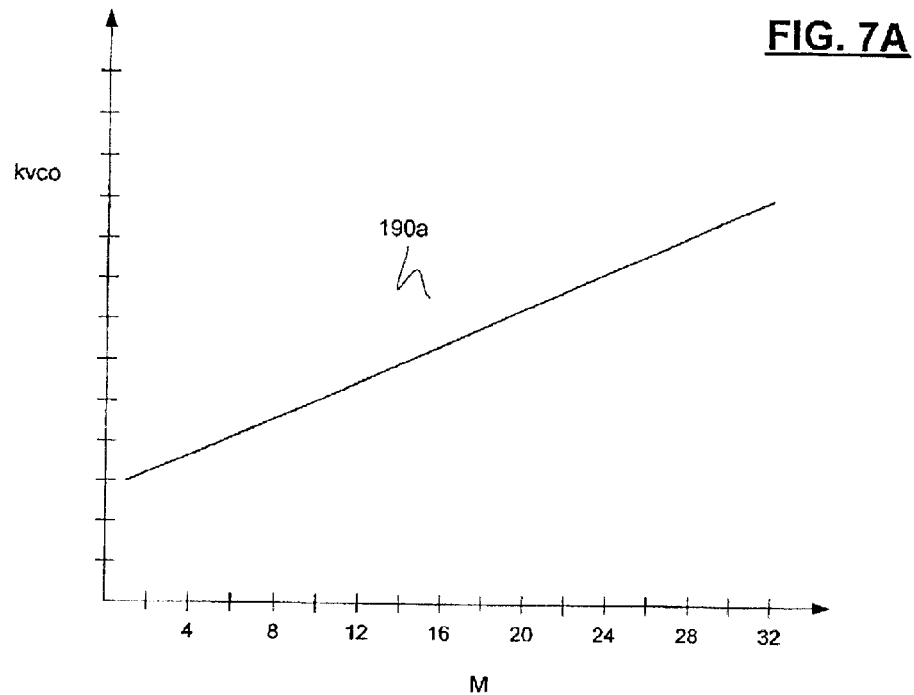
FIGS. 7A–7B are graphs depicting the relationship between the VCO constant and PLL divider value in accordance with the present invention.
Figure 7B:
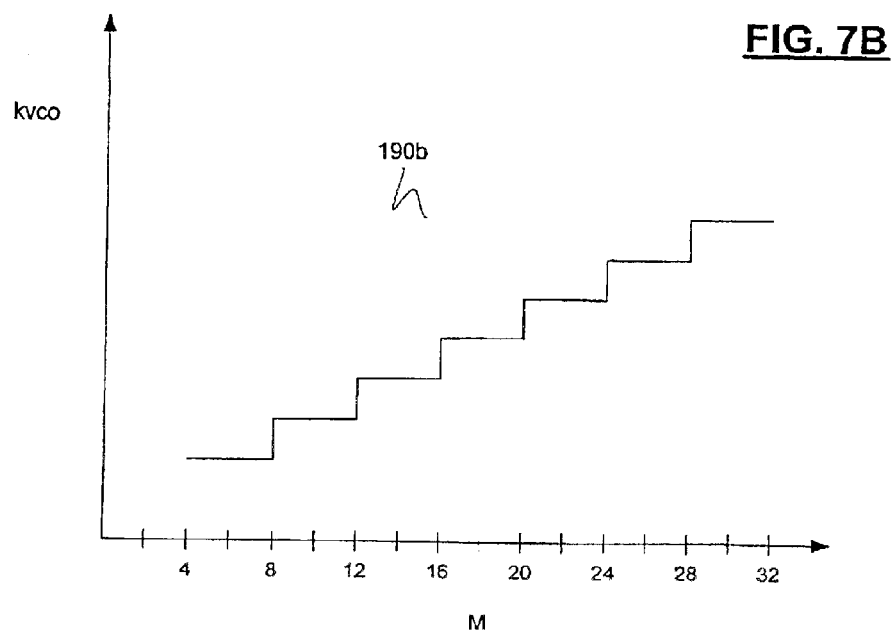

By sizing transistors 132*ap*–134*cn* appropriately, kvco may be increased by a proportion or relative amount about equal or proportional to M. It is well within the abilities of one skilled in the art to design and use transistors appropriately sized for changing kvco by about the same relative amount or proportion as M. For example, one skilled in the art understands that fvco is proportional to the Gm (or transconductance) of a VCO stage (e.g., delay stage 105*x*), divided by the capacitance of the node between VCO stages (e.g., node 170*x* in FIG. 6), and that the transconductance of a VCO stage is proportional to $\mu \cdot k_{ox} \cdot (W/L) \cdot (V_{control} - V_t)$, where $\mu$ is the carrier mobility across a transistor channel, $k_{ox}$ is the dielectric constant of the gate oxide in the transistor(s), W is the width of the transistor(s), L is the length of the transistor(s), $V_{control}$ is voltage applied across the transistor(s) and $V_t$ is the threshold voltage that causes the transistor to conduct. From these equations and the above equations for kvco, fvco, and loop bandwidth, one skilled in the art will understand that kvco (which is proportional to $\mu \cdot k_{ox} \cdot (W/L)$) is now a function of transistor size. As a result, one may empirically determine or select appropriate sizes for the VCO delay stage transistors and plot kvco as a function of M. As shown in FIG. 7A, when the feedback divider information signal has a width sufficient to represent every possible state of the feedback divider factor M, the transistors are sized appropriately and the divider information supplied to the VCO is adequate when the plot 190*a* is roughly linear. FIG. 7B shows a plot 190*b* that is a step function with step heights of roughly equivalent height. This result is obtained when the feedback divider information signal has a width sufficient to represent only a "most significant bits" subset of the possible states of the feedback divider factor M. In the example shown in FIG. 7B, M can be as high as 32 (corresponding to a 5-bit-wide feedback divider configuration signal), but the divider information signal is only 3 bits wide (corresponding to the 3 most significant bits of the feedback divider configuration signal). Consequently, there is a step every four units of M.

In one implementation, transistors 132*ap* and 132*an* have the same number as many legs (or "fingers," as these terms are known in the art) as transistors 180*p* and 180*n*, respectively; transistors 132 bp and 132*bn* have twice as many legs as transistors 132*ap* and 132*an*, respectively; and transistors 132*cp* and 132*cn* have twice as many legs as transistors 132 bp and 132*bn*, respectively. Therefore, the size of transistors 132*ap* and 132*an* may be effectively twice the size of transistors 180*p* and 180*n*, respectively; the size of transistors 132 bp and 132*bn* may be effectively twice the size of transistors 132*ap* and 132*an*, respectively; and the size of transistors 132 cp and 132*cn* may be effectively twice the size of transistors 132 bp and 132*bn*, respectively.

An Exemplary Architecture

In another aspect, the present invention concerns a phase locked loop (PLL) comprising an oscillator control circuit configured to (i) receive a reference signal and a feedback signal and (ii) provide an oscillator control signal; an oscillator comprising a loop of (2n+1) delay stages, where n is an integer of at least 1, configured to (i) receive the control signal and (ii) provide a native periodic signal, at least one delay stage of the oscillator having a characteristic setting circuit configured to set or change a delay characteristic of in response to a divider information signal; and a divider configured to (i) divide the native periodic signal and (ii) provide the feedback signal and the divider information signal.

Figure 2:
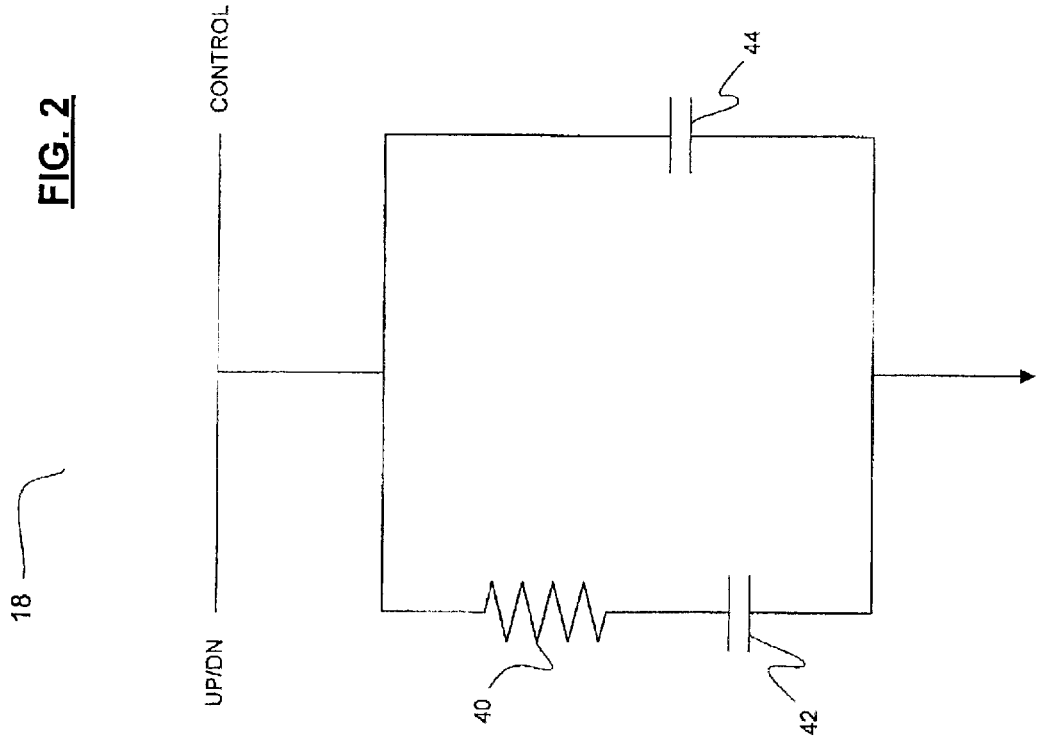
FIG. 2 is a simplified schematic for a conventional second-order PLL filter.
Figure 8:
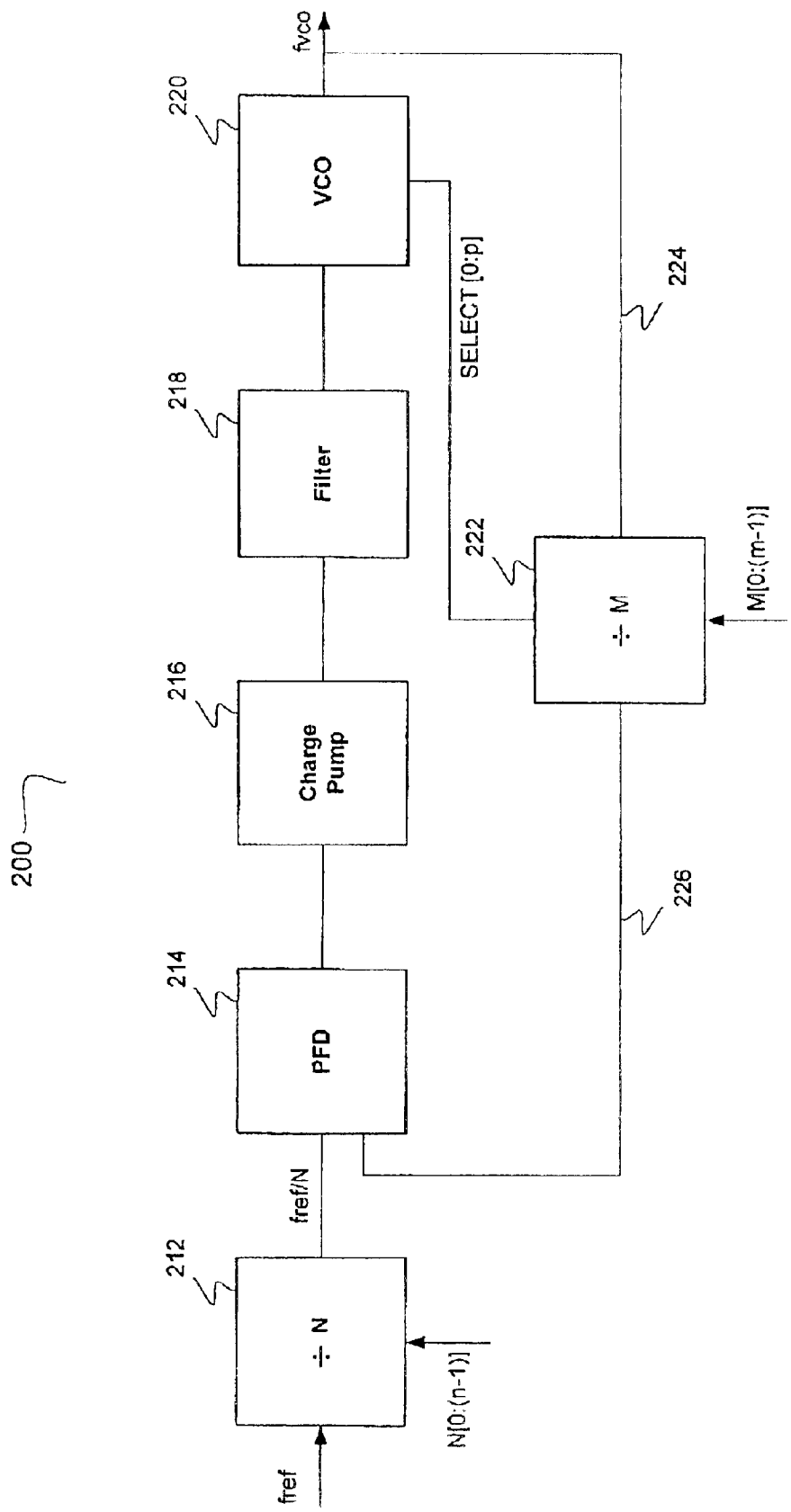
FIG. 8 is a block diagram of an exemplary PLL circuit embodying the present invention.

Referring now to FIG. 8, the present is PLL similar to the PLL of FIG. 1, but with a divider information signal bus SELECT from divider 222 to VCO 220, and with at least one VCO stage (and preferably all of the VCO stages) having a characteristic setting circuit. In the context of the present disclosure, the characteristic setting circuit is equivalent to the above-described characteristic control circuit, but the characteristic setting circuit is part of an oscillator delay stage in the PLL described herein, whereas the characteristic control circuit may be considered separate from a stage in the above-described exemplary oscillator. The divider information signal bus SELECT and the information transmitted on it are essentially the same as for the above-described exemplary oscillator.

Consequently, in preferred embodiments, each of the delay stages may comprise (i) an inverter or a means for delaying a previous stage output; (ii) the characteristic setting circuit may be parallel to the inverter in each delay stage in which the characteristic setting circuit is included; (iii) the characteristic setting circuit may comprise one or more (preferably two or more, and in one embodiment three or more) three-state buffers configured to enter a high impedance state in response to a predetermined state of the divider information signal; (iv) both the inverter and the three-state buffer may be configured to receive a previous delay stage output and provide a next delay stage input; and/or (v) each of the three-state buffers may comprise first and second PMOS transistors in series and first and second NMOS transistors in series, the first PMOS transistor and the first NMOS transistor receiving the previous delay stage output and provide the next stage input, and the second PMOS transistor and the second NMOS transistor receiving the divider information signal.

Where the phase locked loop includes more than one three-state buffer, each three-state buffer may be further configured to (i) receive the previous delay stage output and provide the next delay stage input; (ii) receive at least one unique bit of the divider information signal; (iii) change the delay characteristic by a predetermined amount, and preferably each three-state buffer changes the delay characteristic by a unique and/or different amount.

As for the present oscillator, the delay characteristic may be selected from the group consisting of a delay time, a transition time, a rise rate, a fall rate, a resistance, a capacitance, a transistor size, a number of transistor legs and a current sourcing and/or sinking capability. In preferred embodiments, the delay characteristic comprises a delay time and/or a number of transistor legs.

Similar to the phase locked loop of FIG. 1, the present PLL (and notably, the oscillator control circuit) may further comprise (1) a phase detector 214 configured to (i) receive the reference signal and the feedback signal, and (ii) provide a phase adjustment signal; (2) a charge pump 216 configured to (i) receive a phase adjustment signal and (ii) provide the oscillator control signal (e.g., a VCO adjustment signal); and/or (3) a filter 218 configured to (i) receive a VCO adjustment signal and (ii) provide the oscillator control signal. The phase detector may be any of the four conventional types of phase or phase-frequency detectors, configured to provide one or more conventional "up" and/or "down" signals (e.g., UP/DN in FIG. 1) to respectively instruct conventional charge pump 216 to source more or less current in VCO 220 to adjust the phase and/or frequency of the periodic signal output by VCO 220 and/or the feedback signal 226. In one implementation, filter 218 comprises second-order filter 18 in FIG. 2. Thus, the PLL may include a means for comparing a reference signal and a feedback signal, a means for providing a periodic signal, a means for adjusting the frequency of the periodic signal, and/or a means for dividing the periodic signal and providing divider information to a means for setting and/or changing an oscillator delay characteristic.

The divider 222, which is conventional except for providing divider information on divider information bus SELECT, is generally configured to divide the native periodic signal output by VCO 220 by a positive integer. Thus, the feedback signal 226 in FIG. 8 fed to phase detector 212 may comprise or consist of the divided native periodic signal. As described above for the present oscillator, the divider information signal may comprise p bits, where p is an integer and $2^p$ is less than or equal to a maximum value of the positive integer.

An Exemplary Method

The present invention further relates to a method of tracking loop bandwidth in a PLL, comprising the steps of generating a periodic signal from an oscillator, dividing the periodic signal by a first number, and setting a characteristic property of at least part of the oscillator in accordance with the first number.

In preferred embodiments, the number by which the periodic signal is divided is a positive integer of two or more; the oscillator comprises a loop of (2n+1) stages, where n is an integer of at least 1; the setting step comprises setting the characteristic property of each of the stages of the oscillator in accordance with the first number; and/or the characteristic property comprises a stage delay characteristic of at least one of the stages, and more preferably, each of the stages.

In a further embodiment, the method may further comprise (i) communicating divider information based on the first number to the oscillator, (ii) comparing the feedback signal with a reference signal; and/or (iii) adjusting the frequency of the periodic signal in response to an outcome from the comparing step.

In certain implementations, (1) the divider information may comprise a digital signal having p bits, where $2^p$ is less than or equal to a maximum value of the first number; (2) at least one oscillator stage comprises an inverter and a three-state buffer, and preferably, each of the stages comprises an inverter and a three-state buffer; (3) the setting step comprises activating a predetermined number of transistors in each stage operating on a previous stage output; (4) the characteristic property may be a delay time, a transition time, a rise rate, a fall rate, a resistance, a capacitance, a number of transistor legs and a current sourcing and/or sinking capability, preferably a delay time and/or a number of transistor legs.

One object of the method is to provide a VCO gain that is essentially a linear function of the divider factor M of the divider in the PLL over a wide range of operating frequencies. FIG. 7B shows that kvco as a function of the divider factor M may not be exactly linear in all cases. In this example, the number of possible states of digital divider information is less than the maximum possible divider factor, resulting in a step function when each value of M is plotted. However, the plot will appear to be roughly linear if the data is plotted every 4 units of M.

CONCLUSION/SUMMARY

Thus, the present invention provides a circuit, architecture and method for tracking loop bandwidth in a PLL configuration to make its VCO gain a linear function of its divider value over a wide range of frequencies.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An oscillator comprising a loop having (2n+1) stages, where n is an integer of at least 1, and at least three of the stages comprise:
    a) a delay circuit configured to (i) receive a previous stage output and (ii) generate a next stage input; and
    b) a characteristic control circuit configured to (i) receive divider information and (ii) set or change a delay characteristic of said delay circuit in response to said divider information.

2. The oscillator of claim 1, wherein each of said delay circuits comprises an inverter.

3. The oscillator of claim 1, wherein said characteristic control circuit is parallel to said delay circuit.

4. The oscillator of claim 1, wherein each of said stages comprises said delay circuit and said characteristic control circuit.

5. The oscillator of claim 1, wherein each of said characteristic control circuits comprises a first three-state buffer configured to enter a high impedance state in response to a first predetermined state of said divider information.

6. The oscillator of claim 5, wherein said first three-state buffer is parallel to said delay circuit.

7. The oscillator of claim 5, wherein said first three-state buffer is further configured to receive said previous stage output and generate said next stage input.

8. The oscillator of claim 5, wherein said first three-state buffer comprises first and second PMOS transistors in series and first and second NMOS transistors in series, said first PMOS transistor and said first NMOS transistor being configured to receive said previous stage output and provide said next stage input, and said second PMOS transistor and said second NMOS transistor being configured to receive said divider information.

9. The oscillator of claim 5, wherein each of said stages further comprises a second three-state buffer configured to enter a high impedance state in response to a second predetermined state of said divider information.

10. The oscillator of claim 9, wherein each of said and second three-state buffers are parallel to said delay circuit and to each other.

11. The oscillator of claim 10, wherein each of said first and second three-state buffers are further configured to receive said previous stage output and provide said next stage input.

12. The oscillator of claim 9, wherein said first three-state buffer receives at least a first bit of said divider information, and said second three-state buffer receives at least a second bit of said divider information.

13. The oscillator of claim 12, wherein said first three-state buffer changes said delay characteristic by a first amount, and said second three-state buffer changes said delay characteristic by a second amount different from said first amount.

14. The oscillator of claim 5, wherein each of said stages further comprises a third three-state buffer configured to enter a high impedance state in response to a third predetermined state of said divider information.

15. The oscillator of claim 14, wherein each of said first, second and third three-state buffers are parallel to said delay circuit and to each other.

16. The oscillator of claim 15, wherein each of said first, second and third three-state buffers are further configured to receive said previous stage output and provide said next stage input.

17. The oscillator of claim 14, wherein said first three-state buffer receives at least a first bit of said divider information, said second three-state buffer receives at least a second bit of said divider information, and said third three-state buffer receives at least a third bit of said divider information.

18. The oscillator of claim 17, wherein said first three-state buffer changes said delay characteristic by a first amount, said second three-state buffer changes said delay characteristic by a second different from said first amount, and said third three-state buffer changes said delay characteristic by a third amount different from each of said first and second amounts.

19. The oscillator of claim 1, wherein said delay characteristic is selected from the group consisting of a delay time, a transition time, a rise rate, a fall rate, a resistance, a capacitance, a transistor size, a number of transistor legs and a current sourcing and/or sinking capability.

20. The oscillator of claim 19, wherein said delay characteristic comprises a delay time.

21. The oscillator of claim 19, wherein said delay characteristic comprises a number of transistor legs.

22. The oscillator of claim 1, wherein said divider information is taken from a divider factor applied to a periodic signal output from said oscillator.

23. The oscillator of claim 22, wherein said divider factor is a positive integer.

24. The oscillator of claim 23, wherein said divider information comprises p bits, where p is an integer and $2^p$ is less than or equal to a maximum value of said divider factor.

25. An oscillator, comprising a loop of (2n+1) stages, where n is an integer of at least 1, and each of said stages comprises:

a) a native means for propagating a previous stage output; and b) means for setting and/or changing a delay characteristic of said means for propagating is response to divider information.

26. The oscillator of claim 25, wherein each of said means for propagating comprises an inverter.

27. The oscillator of claim 25, wherein each of said means for setting and/or changing comprises a means for adding a parallel means for propagating to said native means for propagating.

28. The oscillator of claim 25, wherein said means for adding comprises a first three-state buffer configured to enter a high impedance state in response to a first predetermined state of said divider information.

29. The oscillator of claim 28, wherein said means for adding further comprises a second three-state buffer configured to enter said high impedance state in response to a second predetermined state of said divider information.

30. The oscillator of claim 29, wherein said first three-state buffer changes said delay characteristic by a first amount, and said second three-state buffer changes said delay characteristic by a second amount different from said first amount.

31. The oscillator of claim 29, wherein said means for adding further comprises a third three-state buffer configured to enter said high impedance state in response to a third predetermined state of said divider information.

32. The oscillator of claim 31, wherein said first three-state buffer changes said delay characteristic by a first amount, said second three-state buffer changes said delay characteristic by a second amount different from said first amount, and said third three-state buffer changes said delay characteristic by a third amount different from each of said first and second amounts.

33. The oscillator of claim 25, wherein said delay characteristic is selected from the group consisting of a delay time, a transition time, a rise rate, a resistance, a capacitance, a transistor size, a number of transistor legs and a current sourcing and/or sinking capability.

34. The oscillator of claim 33, wherein said delay characteristic comprises a delay time.

35. The oscillator of claim 33, wherein said delay characteristic comprises a number of transistor legs.

36. The oscillator of claim 25, wherein said divider information is taken from a divider factor applied to a periodic signal output from said oscillator.

37. The oscillator of claim 36, wherein said divider factor is a positive integer.

38. The oscillator of claim 37, wherein said divider information comprises p bits, where p is an integer and $2^p$ is less than or equal to a maximum value of said divider factor.

39. A phase locked loop architecture, comprising:

a) an oscillator control circuit configured to (i) receive a reference signal and a feedback signal and (ii) provide an oscillator control signal;

b) an oscillator configured to (i) receive said control signal and (ii) provide a native periodic signal, said oscillator comprising a loop of (2n+1) delay stages, where n is an integer of at least 1, and at least one of said delay stages further comprises a characteristic setting circuit configures to set or change a delay characteristic of said at least one of said delay stages in response to a divider information signal; and c) a divider configured to (i) divide said native periodic signal and (ii) provide said feedback signal and said divider information signal.

40. The phase locked loop architecture of claim 39, wherein each of said delay stage comprises an inverter.

41. The phase locked loop architecture of claim 40, wherein said characteristic setting circuit is parallel to said inverter in each of said at least one of said delay stages.

42. The phase locked loop architecture of claim 40, wherein each of said delay stages further comprises said characteristic setting circuit.

43. The phase locked loop architecture of claim 42, wherein each of said characteristic setting circuits is parallel to one of said inverters.

44. The phase locked loop of claim 39, wherein said characteristic setting circuit comprises a three-state buffer configured to enter a high impedance state in response to a first predetermined state of said divider information signal.

45. The phase locked loop architecture of claim 39, wherein said at least one of said delay stages comprises (i) a first inverter and (ii) a first three-state buffer parallel to said first inverter, both said first inverter and said first three-state buffer bing configured to receive a previous delay stage output and provide a next delay stage input.

46. The phase locked loop architecture of claim 39, wherein each of said delay stages comprises (i) a first inverter and (ii) a first three-state buffer parallel to said first inverter, both said first inverter and said first three-state buffer configured to receive a previous delay stage output and provide a next delay stage input.

47. The phase locked loop architecture of claim 46, wherein each of said first three-state buffers comprises first and second PMOS transistors in series and first and second NMOS transistors in series, said first PMOS transistor and said first NMOS transistor receiving said previous delay stage output and provide said next stage input, and said second PMOS transistor and said second NMOS transistor receiving said divider information signal.

48. The phase locked loop architecture of claim 44, wherein said characteristic setting circuit further comprises a second three-state buffer configured to enter a high impedance state in response to a second predetermined state of said divider information.

49. The phase locked loop architecture of claim 48, wherein said second three-state buffer is further configured to receive said previous delay stage output and provide said next delay stage input.

50. The phase locked loop architecture of claim 48, wherein said first three-state buffer receives at least a first bit of said divider information signal, and said second three-state buffer receives at least a second bit of said divider information signal.

51. The phase locked loop architecture of claim 48, wherein said first three-state buffer changes said delay characteristic by a first amount, and said second three-state buffer changes said delay characteristic by a second amount different from said first amount.

52. The phase locked loop architecture of claim 45, wherein said characteristic setting circuit further comprises a third three-state buffer configured to enter a high impedance state in response to a third predetermined state of said divider information.

53. The phase locked loop architecture of claim 52, wherein said third three-state buffer is further configured to receive said previous delay stage output and provide said next delay stage input.

54. The phase locked loop architecture of claim 52, wherein said first three-state buffer receives at least a first bit of said divider information, said second three-state buffer receives at least a second bit of said divider information, and said third three-state buffer receives at least a third bit of said divider information.

55. The phase locked loop architecture of claim 52, wherein said first three-state buffer changes said delay characteristic by a first amount, said second three-state buffer changes said delay characteristic by a second amount different from said first amount, and said third three-state buffer changes said delay characteristic by a third amount different from each of said first and second amounts.

56. The phase locked loop architecture of claim 39, wherein said delay characteristic is selected from the group consisting of a delay time, a transition time, a rise rate, a fall rate, a resistance, a capacitance, a transistor size, a number of transistor legs and a current sourcing and/or sinking capability.

57. The phase locked loop architecture of claim 56, wherein said delay characteristic comprises a delay time.

58. The phase locked loop architecture of claim 56, wherein said delay characteristic comprises a number of transistor legs.

59. The phase locked loop architecture of claim 39, wherein said oscillator control circuit comprises a phase detector configured to (i) receive said reference signal and said feedback signal, and (ii) provide a phase adjustment signal.

60. The phase locked loop architecture of claim 39, wherein said oscillator control circuit comprises a charge pump configured to (i) receive a phase adjustment signal and (ii) provide said oscillator control signal.

61. The phase locked loop architecture of claim 59, wherein said oscillator control circuit further comprises a charge pump configured to (i) receive said phase adjustment signal and (ii) provide a VCO adjustment signal.

62. The phase locked loop architecture of claim 39, wherein said oscillator control circuit comprises a filter configured to (i) receive a VCO adjustment signal and (ii) provide said oscillator control signal.

63. The phase locked loop architecture of claim 61, wherein said oscillator control circuit further comprises a filter configured to (i) receive said VCO adjustment signal and (ii) provide said oscillator control signal.

64. The phase locked loop architecture of claim 39, wherein said divider is further configured to divide said native periodic signal by a positive integer.

65. The phase locked loop architecture of claim 64, wherein said divider information signal comprises p bits, where p is an integer and $2^p$ is less than or equal to a maximum value of said positive integer.

66. A phase locked loop (PLL), comprising:
  a) means for comparing a reference signal and a feedback signal;
  b) means for providing a periodic signal having a frequency;
  c) means for setting a delay characteristic of at least part of said means for providing said periodic signal in response to divider information; and
  d) means for dividing said periodic signal and providing said divider information to said means for changing said delay characteristic.

67. The PLL of claim 66, wherein said means for providing said periodic signal comprises a loop of (2n−1) stages, where n is an integer of at least 1.

68. The PLL of claim 67, wherein each of said stages comprises a means for delaying a previous stage output.

69. The PLL of claim 68, wherein each of said means for delaying comprises an inverter.

70. The PLL of claim 67, wherein said at least part of said means for providing comprises one of said stages, and said means for setting comprises a means for setting a stage delay characteristic of said stage.

71. The PLL of claim 70, further comprising a plurality of means for setting a stage delay characteristic of the reminder of said stages.

72. The PLL of claim 70, wherein said means for setting a stage delay characteristic receives (i) said divider information from said means for dividing and (ii) a previous stage output.

73. The PLL of claim 72, wherein said means for setting a stage delay characteristic comprises a three-state buffer.

74. The PLL of claim 72, wherein said means for setting a stage delay characteristic comprises a plurality of parallel three-state buffers.

75. The PLL of claim 71, where each of said plurality of means for setting a stage delay characteristic receives (i) said divider information and (ii) a previous stage output.

76. The PLL of claim 67, wherein said delay characteristic is selected from the group consisting of a delay time, a transition time, a rise rate, a fall rate, a resistance, a capacitance, a transistor size, a number of transistor legs and a current sourcing and/or sinking capability.

77. The PLL of claim 67, further comprising a means for adjusting said frequency of said periodic signal in response to an output from said means for comparing.

78. A method of dynamically tracking a phase locked loop configuration, comprising the steps of:
   a) generating a periodic signal from an oscillator, said periodic signal having a first frequency and said oscillator comprising a loop of (2n+1) stages, where n is an integer of at least 1;
   b) dividing said periodic signal by a first number; and
   c) setting a characteristic property of at least part of said oscillator in accordance with said first number.

79. The method of claim 78, wherein said first number is a positive integer of two or more.

80. The method of claim 78, wherein said setting step comprises setting said characteristic property of each of said stages of said oscillator in accordance with said first number.

81. The method of claim 78, wherein said characteristic property comprises a stage delay characteristic of at least one of said stages.

82. The method of claim 78, wherein said characteristic property comprises a delay characteristic of each of said stages.

83. The method of claim 78, further comprising communicating divider information based on said first number to said oscillator.

84. The method of claim 83, wherein said divider information comprises a digital signal having p bits, where $2^p$ is less than or equal to a maximum value of said first number.

85. The method of claim 78, wherein said at least one stage comprises an invertor and a three-state buffer.

86. The method of claim 85, wherein each of said stages comprises an inverter and a three-state buffer.

87. The method of claim 86, wherein said setting step comprises activating a predetermined number of transistors in each stage operating on a previous stage output.

88. The method of claim 78, wherein said characteristic property is selected from the group consisting of a delay time, a transition time, a rise rate, a fall rate, a resistance, a capacitance, a number of transistor legs and a current sourcing and/or sinking capability.

89. The method of claim 78, further comprising the step of comparing a feedback signal with a reference signal.

90. The method of claim 89, further comprising adjusting said frequency of said periodic signal with a reference signal.

91. The method of claim 85, wherein said three-state buffer is configured to enter a high impedance state in response to a first predetermined state of divider information based on said first number and communicated to said oscillator.

92. The method of claim 91, wherein said three-state buffer is parallel to said inverter.

93. The method of claim 92, wherein said inverter and said three-state buffer each receive a previous stage output and together generate a next stage input.

94. The method of claim 91, wherein said at least one stage further comprises a second three-state buffer configured to enter a high impedance state in response to a second predetermined state of said divider information.

95. The method of claim 86, wherein each of said three-state buffers is configured to enter a high impedance state in response to a first predetermined state of divider information based on said first number and communicated to said oscillator.

96. The method of claim 95, wherein each of said three-state buffers is parallel to said inverter.

97. The method of claim 96, wherein said inverter and said three-state buffer in each stage receive a previous stage output and together generate a next stage input.

98. The method of claim 95, wherein each of said stages further comprises a second three-state buffer configured to enter a high impedance state in response to a second predetermined state of said divider information.

99. The method of claim 98, wherein each of said stages further comprises a third three-state buffer configured to enter a high impedance state in response to a third predetermined state of said divider information.

100. The method of claim 99, wherein each of said first, second and third three-state buffers are parallel to said inverter and to each other.

101. The method of claim 99, wherein each of said first, second and third three-state buffers are further configured to receive a previous stage output and provide a next stage input.

* * * * *

UNITED STATES PATENT AND TRADEMARK OFFICE
CERTIFICATE OF CORRECTION

PATENT NO. : 6,850,124 B1
APPLICATION NO. : 10/464278
DATED : February 1, 2005
INVENTOR(S) : Yingxuan Li It is certified that error appears in the above-identified patent and that said Letters Patent is hereby corrected as shown below:

| | |
|---|---|
| Title Page, Item (56) | Under "OTHER PUBLICATIONS", first reference beginning with "Chen" delete "51-6" and insert --51-61-- |
| Column 1, Line 11 | Delete "MIN" and insert --M/N-- |
| Column 4, Line 12 | Delete "arc" and insert --are-- |
| Column 4, Line 32 | Delete arc" and insert --are-- |
| Column 5, Line 50 | Insert a space between "105x" and "includes" |
| Column 5, Line 59 | Insert a space between "120x" and "is" |
| Column 6, Line 48 | Insert a space between "120X" and "receives" |
| Column 8, Line 18 | Insert -- = -- after "(kvco/M)" |
| Column 8, Line 26 | Delete ">" and insert --≥-- |
| Column 8, Line 42 | Insert space between "180x" and "in" |
| Column 8, Line 44 | Insert space between "180x" and "on" |
| Column 8, Line 47 | Delete space between "132" and "cp" |
| Column 8, Line 50 | Delete space between "134" and "cp" |
| Column 8, Line 54 | Delete space between "134" and "cp" |
| Column 9, Line 2 | Delete space between "134" and "cp" |
| Column 10, Line 8 | Delete space between "132" and "cp" |
| Column 10, Line 9 | Delete space between "132" and "bp" |
| Column 13, Line 10 | Insert --first-- after "said" |
| Column 13, Line 44 | Insert --amount-- after "second" |
| Column 14, Line 4 | Delete "is" and insert --in-- |
| Column 14, Line 38 | Insert --a fall rate,-- after "a rise rate" |
| Column 14, Line 62 | Delete "configures" and insert --configured-- |
| Column 15, Line 2 | Delete "stage" and insert --stages-- |
| Column 15, Line 12 | Insert --architecture-- after "loop" |
| Column 15, Line 20 | Delete "bing" and insert --being-- |
| Column 15, Line 26 | Insert --being-- after "buffer" |

UNITED STATES PATENT AND TRADEMARK OFFICE
CERTIFICATE OF CORRECTION

PATENT NO. : 6,850,124 B1
APPLICATION NO. : 10/464278
DATED : February 1, 2005
INVENTOR(S) : Yingxuan Li It is certified that error appears in the above-identified patent and that said Letters Patent is hereby corrected as shown below:

Column 18, Line 12     Delete "with a reference signal" and insert --in response to an outcome from said comparing step--

Signed and Sealed this

Thirteenth Day of March, 2007

JON W. DUDAS
*Director of the United States Patent and Trademark Office*